United States Patent
López Rodriguez et al.

(10) Patent No.: US 9,081,052 B2
(45) Date of Patent: Jul. 14, 2015

(54) MONITORING MODULE AND METHOD FOR DETERMINING THE STATUS OF ELECTRICAL COMPONENTS

(75) Inventors: Juan Luis López Rodriguez, Barcelona (ES); Marc Bautista Palacios, Barcelona (ES); Marina Ferran Farrés, Barcelona (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 437 days.

(21) Appl. No.: 13/250,879

(22) Filed: Sep. 30, 2011

(65) Prior Publication Data

US 2013/0082716 A1    Apr. 4, 2013

(51) Int. Cl.
*G01R 31/02* (2006.01)
*G01R 31/28* (2006.01)
*G01R 31/3193* (2006.01)

(52) U.S. Cl.
CPC ........ *G01R 31/2836* (2013.01); *G01R 31/2884* (2013.01); *G01R 31/3193* (2013.01)

(58) Field of Classification Search
CPC ............. G01R 31/2805; G01R 31/024; G01R 31/2812; G01R 31/2884; G01R 31/2853; G01R 31/025; G01R 31/31924; G01R 31/31922; G01R 31/31937; G01R 31/088; G01R 31/085; G01R 31/08; G01R 31/083; G01R 31/086
USPC ........... 324/537, 525, 750.01, 500, 522, 512, 324/511; 340/635, 648, 679
See application file for complete search history.

(56) References Cited

U.S. PATENT DOCUMENTS

| | | | | |
|---|---|---|---|---|
| 5,835,786 A * | 11/1998 | Brown et al. | | 710/15 |
| 6,720,774 B2 | 4/2004 | Meert et al. | | |
| 6,814,546 B2 * | 11/2004 | Sekiguchi | | 417/3 |
| 7,206,176 B2 | 4/2007 | Bielesch | | |
| 8,587,262 B2 * | 11/2013 | Kouchi et al. | | 320/165 |
| 2002/0075615 A1 * | 6/2002 | Miermans | | 361/78 |
| 2002/0093358 A1 * | 7/2002 | Kang | | 324/765 |
| 2005/0190511 A1 * | 9/2005 | Crane et al. | | 361/23 |
| 2006/0017582 A1 * | 1/2006 | Lockhart et al. | | 340/636.1 |
| 2006/0176186 A1 * | 8/2006 | Larson et al. | | 340/635 |
| 2008/0164822 A1 * | 7/2008 | Serebryanov et al. | | 315/129 |
| 2008/0198674 A1 * | 8/2008 | Keller | | 365/201 |
| 2009/0228163 A1 | 9/2009 | Tarchinski | | |
| 2012/0268158 A1 * | 10/2012 | Miyata et al. | | 324/761.01 |

FOREIGN PATENT DOCUMENTS

JP    2007233285 A    9/2007
WO   WO-2004004089    1/2004

OTHER PUBLICATIONS

Dirac, P.A.M., Component Failure Analysis, Series-Parallel Combination Circuits, Oct. 18, 2006 (6 pages).

* cited by examiner

*Primary Examiner* — Huy Q Phan
*Assistant Examiner* — Thang Le

(57) ABSTRACT

According to one example, there is provided a monitoring module for determining the status of electrical components in an array of N electrical components. The monitoring module comprises a resistance measurer to measure the resistance across a pair of diagnostic terminals, a comparator to compare the measured resistance with a set of reference resistances, and a status module to determine the status of at least one electrical component in the array based on the comparison.

17 Claims, 2 Drawing Sheets

MONITORING MODULE AND METHOD FOR DETERMINING THE STATUS OF ELECTRICAL COMPONENTS

BACKGROUND

Many electrical components have a tendency to fail at some point in time. Components may fail for a wide variety of reasons including, for example, overheating, manufacturing defects, component material fatigue or breakdown, and excessive current, to name but a few.

In many electronic and electrical devices it is helpful to be able to quickly identify failed components so that they may be replaced.

Some electrical components provide electrical diagnostic signals that enable a monitoring circuit or module to determine the state of a component. For example, some electrical motors or fans provide diagnostic signals in the form of an electrical waveform having a frequency proportional to the speed of the motor. A monitoring circuit may then determine the speed of the motor, using the diagnostic signal, and may hence determine whether the motor is operating correctly or not.

Such diagnostic signals may be useful when a single component is to be monitored, but may be unmanageable when a large number of components require monitoring. For example, some electronic devices, such as industrial printers, may include 30 or more fans, that are used for device cooling or for drying ink.

When arrays of electrical components are to be monitored, the diagnostic signals from each component generally have to be individually connected to individual monitoring circuits. This is because electrically connecting diagnostic waveform signals together results in a waveform from which it is difficult to determine which diagnostic signal relates to which component. Furthermore, the additional wiring necessary for connecting individual diagnostic signals to individual monitoring circuits increases the associated complexity and cost.

BRIEF DESCRIPTION

Examples or embodiments of the invention will now be described, by way of non-limiting example only, with reference to the accompanying drawings, in which.

DETAILED DESCRIPTION

The examples and embodiments described herein enable an array of electrical components to be monitored in a simple and low-cost manner and enable a determination to be made as to whether all of the components in the array are working correctly, whether a component in the array has failed, and whether a component has been disconnected from the array of components. A further example further enables an individual one of the components in the array of components to be identified as being disconnected from the array.

Figure 1:
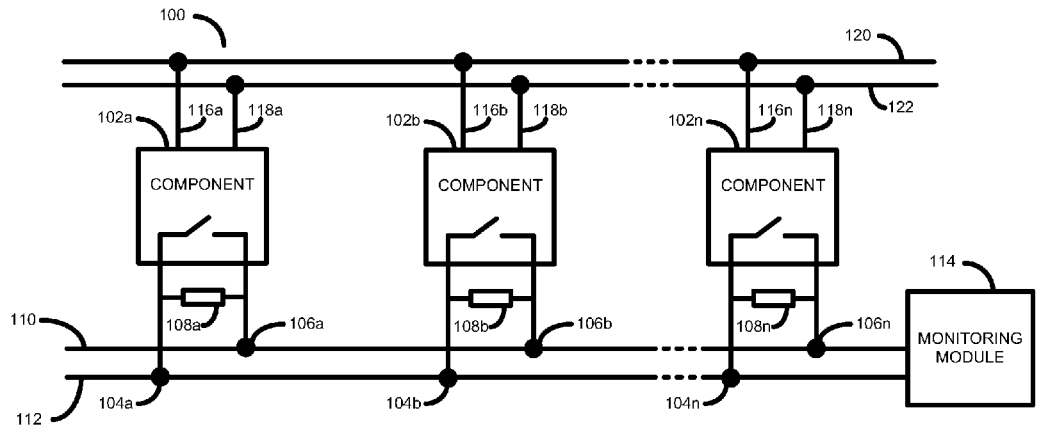
FIG. 1 is a simplified block diagram illustrating a portion of an electrical device 100 according to one example.

Referring now to FIG. 1 there is shown a simplified block diagram of an electrical device 100 according to an example of the present invention. In the present example the electrical device 100 uses a direct current (DC) supply. In other examples, an electrical device may use an alternating current (AC) supply. The components 102 may be any suitable component.

The device 100 comprises a first direct current (DC) power supply line 120, and a second DC power supply line 122. The power supply lines 120 and 122 may be suitably connected, either directly or indirectly, to a power supply source (not shown). In one example the first supply line 120 may be at a first voltage level, such as +5V, and the second supply line 122 may be at a second voltage level, such as 0V. In other examples different supply voltages may be used.

The device 100 further comprises an array of electrical components 102a to 102n. Each component 102a to 102n is connected to the power supply lines 120 and 122 by first and second power supply terminals 116 and 118.

Each electrical component 102 additionally comprises two diagnostic terminals 104 and 106. Each component 102 exhibits a resistance across the diagnostic terminals 104 and 106 that varies according to the status of the component such that:

1) when the component is functioning correctly the resistance measured between the two diagnostic terminals 104 and 106 of a component is a predetermined first resistance; and
2) when the component has failed the resistance measured between the two diagnostic terminals 104 and 106 of a component is a second predetermined resistance.

In one example the first predetermined resistance is a resistance in the order of 10 kΩ to 10 MΩ and second predetermined resistance is a resistance of about 100Ω or below. In other examples other resistance values may be used.

In one example, components 102 as supplied by a manufacturer exhibit the above-described properties across a pair of diagnostic terminals 104 and 106. For example, the diagnostic terminals 104 and 106 may be connected to an internal diagnostic module, as shown by 410 of FIG. 4, that exhibits the above-described properties.

In a further example, components that do not exhibit the above-described properties may be modified, for example, prior to or during installation in the system 100 to exhibit the above-described properties. For example, many conventional fans and motors have a pair of diagnostic terminals 104 and 106 which exhibit a short-circuit or low-resistance when the component fails, and a high-resistance or open circuit when the component is operating correctly. For such components, an additional resistance 108 may be connected in parallel to the diagnostic terminals 104 and 106, thereby becoming effectively integrated into the diagnostic module, as shown by 410 of FIG. 4. The resistance 108 may be either integral to the component housing, or may be fitted external to the component housing. The resistance 108 may be provided, for example, by a single resistor having a predetermined resistance value, or by a combination of resistors connected in series and/or in parallel.

The diagnostic terminals 104 of each component 102 are connected to a diagnostic line 112, and the diagnostic terminals 106 of each component 102 are connected to a diagnostic line 110. In this way, the diagnostic terminals of each component 102 are connected in parallel with one another.

A monitoring module 114 measures the resistance across the diagnostic lines 110 and 112. The monitoring module may, for example, be any suitable resistance measuring circuit. In one example the monitoring module 114 includes a reference resistance and a comparator.

Referring again to FIG. 1, each of the components 102 are illustrated in a normal operating state, in which the internal resistance of each component is high or an open circuit. In this case, the resistance measured Rt by the monitoring module 114 across the diagnostic lines 110 and 112 will be, or will substantially be, the resistance of each of the resistors 108a to 108n in parallel. According to Ohm's law, the measured resistance Rt will be:

$$\frac{1}{Rt} = \frac{1}{Ra} + \frac{1}{Rb} + \cdots \frac{1}{Rn}$$

Where each of the resistances Ra to Rn has the value R, Rt can be simplified to:

$$Rt = \frac{R}{n}$$

Hence, if there are 10 components 102a to 102n in the array of components and each component has a resistance 108 having a value of 10 kΩ, the measured resistance Rt will be 1 kΩ.

Thus, if the monitoring module 114 knows or expects that there are 10 components 102 in the array of components each having a resistance 108 of 10 kΩ, it can determine whether all of the components 102 in the array are correctly functioning if it measures a resistance of 1 kΩ.

Figure 2:
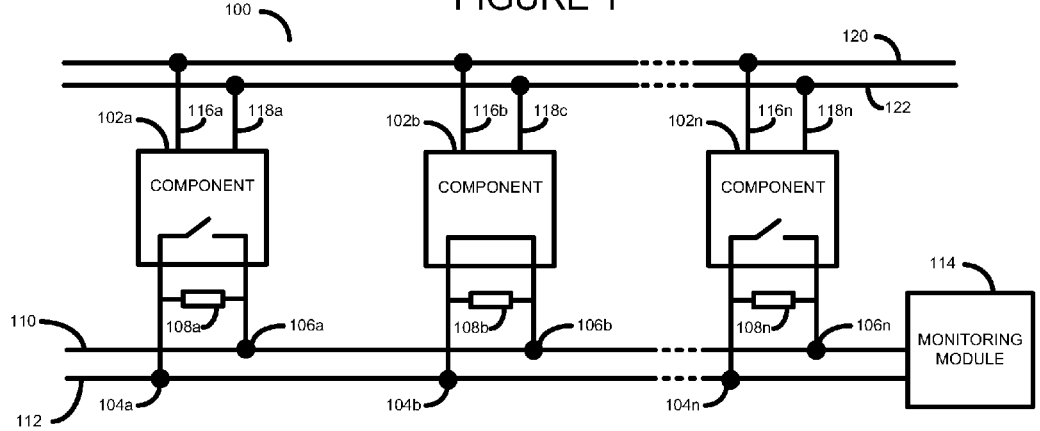
FIG. 2 is a simplified block diagram illustrating a portion of an electrical device 100 according to one example.

Referring now to FIG. 2, each of the components 102a to 102n are illustrated in a normal operating state, apart from component 102b which has a low internal resistance or a short circuit, for example as a result of the component 102b failing. In one example a low internal resistance may be considered as a resistance at or below 100Ω. In other examples a different resistance value may be used.

In this case, the resistance across the diagnostic lines 110 and 112 measured by monitoring module 114 will be zero where the internal resistance of the failed component 102b is zero. Where the internal resistance of the failed component 102b is low, the measured resistance will approach the value of the internal resistance.

Thus, if the monitoring module 114 measures a substantially low or zero resistance across the diagnostic lines 110 and 112 it determines that at least one of the components 102 in the array has failed.

Figure 3:
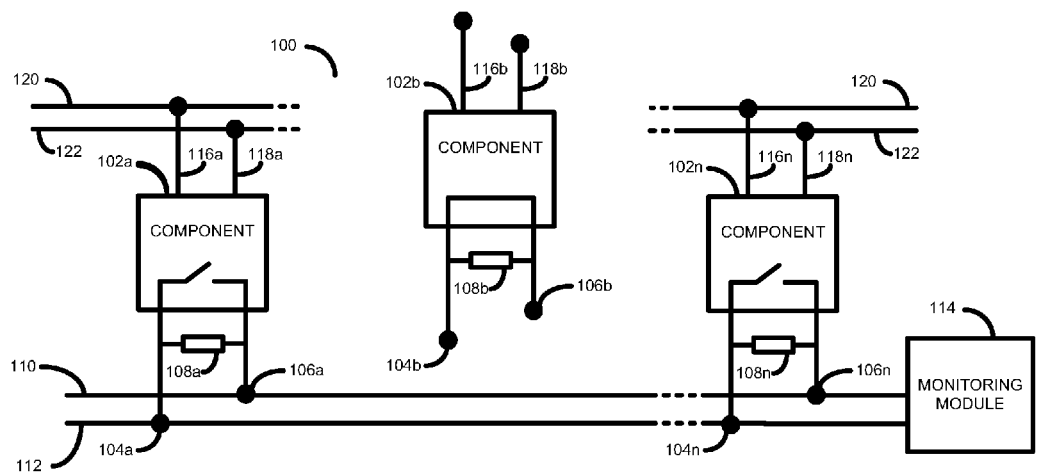
FIG. 3 is a simplified block diagram illustrating a portion of an electrical device 100 according to one example.

Referring now to FIG. 3, each of the N components 102a to 102n are illustrated in a normal operating state, apart from component 102b which is not connected from the diagnostic lines 110 and 112.

In this case, the resistance across the diagnostic lines 110 and 112 measured by the monitoring module 114 will be (where the value of each resistance 108 is R):

$$Rt = \frac{R}{n-1}$$

Hence, if there are 10 components 102a to 102n in the array of n components and each component has a resistance 108 having a value of 10 kΩ, the measured resistance will be 1.1 kΩ.

Thus, if the monitoring module 114 knows or expects that there are 10 components 102 in the array of components each having a resistance 108 of 10 kΩ, it can determine the number of components 102 of the array not connected to the diagnostic lines 110 and 112, based on the difference in the measured resistance and the known reference resistance, as shown below in Table 1.

TABLE 1

| EXAMPLE MEASURED RESISTANCES ARRAY OF 10 COMPONENTS (R = 10 kΩ) | |
|---|---|
| MEASURED RESISTANCE | No. DISCONNECTED COMPONENTS |
| 1 kΩ | 0 |
| 1.1 kΩ | 1 |
| 1.25 kΩ | 2 |
| 1.43 kΩ | 3 |
| 1.67 kΩ | 4 |
| 2 kΩ | 5 |
| 2.5 kΩ | 6 |
| 3.33 kΩ | 7 |
| 5 kΩ | 8 |
| 10 kΩ | 9 |

In this way, the monitoring module 114 can, with a suitable number of reference resistances, determine whether all components 102 in the array are functioning correctly, can determine whether one of the components 102 in the array has failed, or can determine the number of components 102 not connected in the array. In one example the monitoring module 114 is arranged to give a visual or audible indication to a human operator of the above-described determined state of the array.

In a yet further example, each of the components 102a to 102n is arranged such that their associated resistances 108 are unique within the array of components. In one example this may be achieved by the resistance 108 being a variable resistance that may be manually set, for example an operator, to a known resistance value upon installation into the electrical device 100.

In a further example, each resistance 108 may comprise an array of resistors arranged in a switchable array. For example, an 8-bit dual in-line package (DIP) switch could be used to select one of 256 unique resistance values. If each of the unique resistance values are suitably chosen, the monitoring device 114 can not only determine the number of components 102 in the array which are not connected, but also can identify which individual components 102 are not connected. This is particularly useful when, for example, a large array of fans are used in a printing device, enabling an operator to quickly determine which fan or fans in the array are not connected.

For example, in an array of three components having the resistances 108 of:
Component 102a=10 kΩ
Component 102b=12 kΩ
Component 102c=14 kΩ

If all components are functioning correctly and are connected in the array, the resistance measured by the monitoring module 114 will be approximately 3.9 kΩ. If component 102a is disconnected the measured resistance will be approximately 6.5 kΩ. If component 102b is disconnected the measured resistance will be approximately 5.8 kΩ. If component 102c is disconnected the measured resistance will be approximately 5.5 kΩ if components 102a and 102b are disconnected the measure resistance will be approximately 14 kΩ, and so on.

Figure 4:
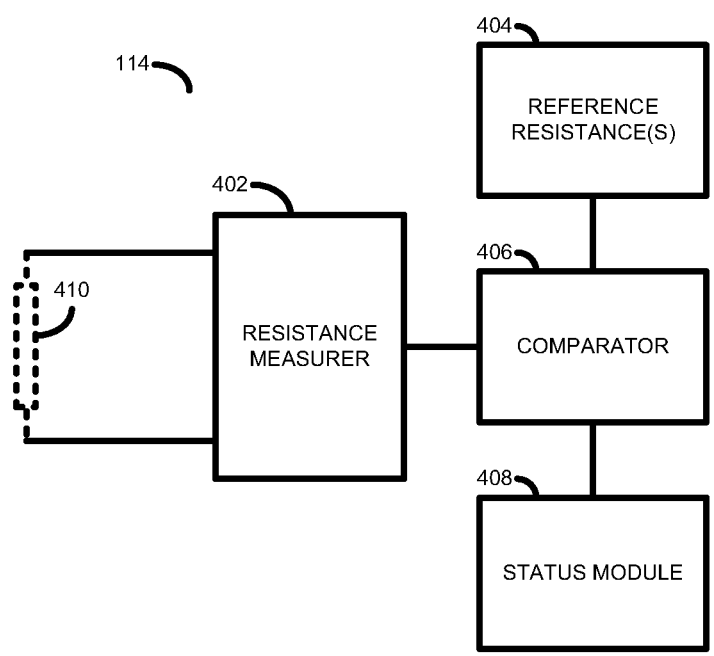
FIG. 4 is a simplified block diagram illustrating a monitoring module according to one example.

Referring now to FIG. 4 is shown a monitoring module 114 in greater detail according to one example. The monitoring module 114 comprises a resistance measurer 402. The resistance measurer 402 may be any suitable resistance measuring circuit. The measured resistance is then compared, by a comparator 406, to one of a set of reference resistances 404. As described above, the reference resistances may include, for example, the reference resistance of the array of components 102 when each component is functioning correctly, and reference resistances when one or more of the components 102 of the array of components is disconnected.

A status module 408 determines, based on the output of the comparator, the state of one or more of the components 102 in the array, as described above. The status module 408 may then issue an alarm or otherwise give an indication of the state of one or more components of the array of components to a human operator.

In further example, the device 100 is a printing system having an array of N fans. In some examples N may be in the region of between about 10 to 40 fans. The printing system has a monitoring module, such as a monitoring module 114 that measures the resistance between a pair of diagnostic lines to which are connectable diagnostic terminals of the N fans in the array of fans. As described above, the monitoring module is able to detect when one or more of the fans has failed, is able to detect when all of the fans are functioning correctly, and is also able to detect when one or more of the fans are disconnected from the array of N fans.

In printing systems having an array of fans this is particularly advantageous, as being able to detect a problem with one or more fans enables a printer operator to determine when a problem with a fan exists, as well as the nature of the problem (i.e. fan failure or disconnection from the array of fans). Consequently, a printer operator may be able to more quickly rectify a problem with a fan. This is particularly important in industrial printing systems where downtime of a printing system is likely to have both workflow and financial consequences.

It will be appreciated in the above-description that reference to specific resistances or resistance measurements may be subject to variations based, for example, on the tolerances of any resistors used, or other tolerances in resistance measurement techniques. Therefore, reference to a specific resistance will be understood as relating to a resistance within such tolerances.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention claimed is:

1. A monitoring module to determine a status of an array of electrical components, comprising:
   a resistance measurer to measure a resistance of the array of electric components connected in parallel across a pair of diagnostic terminals;
   a comparator to compare the measured resistance with a set of reference resistances; and
   a status module to identify, based on the comparing, which electrical component in the array of electrical components has been disconnected, the status module to identify a first electrical component in the array of electrical components as disconnected in response to the measured resistance matching a first reference resistance of the set of reference resistances, and to identify a second electrical component in the array of electrical components as disconnected in response to the measured resistance matching a second reference resistance of the set of reference resistances.

2. The monitoring module of claim 1, wherein the resistance measurer is configured to measure the resistance of diagnostic modules of the electrical components connected in parallel to the diagnostic terminals.

3. The monitoring module of claim 2, wherein the diagnostic module of each electrical component exhibits a first predetermined resistance when the electrical component has failed, and a second predetermined resistance when operating correctly.

4. The monitoring module of claim 2, wherein the resistance exhibited by the diagnostic module of each electrical component in the array is unique when functioning correctly, the unique resistance of a given electrical component in the array being different from the resistances of other electrical components in the array.

5. The monitoring module of claim 1, wherein the status module is to determine that at least one electrical component in the array of electrical components has a failed status in response to the measured resistance being less than or equal to a first predetermined resistance.

6. The monitoring module of claim 5, wherein the first predetermined resistance is less than $100\Omega$.

7. The monitoring module of claim 1, wherein the status module is to determine that all of the electrical components in the array have a functioning status in response to the measured resistance being substantially equal to a second predetermined resistance.

8. The monitoring module of claim 7, wherein the second predetermined resistance is calculated by determining an equivalent parallel resistance of the individual resistances of each electrical components in the array of electrical components.

9. The monitoring module of claim 7, wherein the second predetermined resistance, Rt, is calculated according to $$\frac{1}{Rt} = \frac{1}{R1} + \ldots + \frac{1}{RN},$$

where N represents a number of the electrical components in the array, and R1, ..., RN represent respective resistances of the electrical components in the array.

10. A printer having an array of fans including respective diagnostic modules, comprising:
    a monitoring module to:
        measure a parallel resistance of the diagnostic modules connected in parallel across a pair of diagnostic lines;
        compare the measured parallel resistance to a set of reference resistances; and
        based on the comparing, identify which fan of the array of fans is disconnected, the monitoring module to identify a first fan in the array as disconnected in response to the measured parallel resistance matching a first reference resistance of the set of reference resistances, and to identify a second fan in the array as disconnected in response to the measured parallel resistance matching a second reference resistance of the set of reference resistances.

11. The printer of claim 10, the monitoring module further comprising:

a resistance measurer to measure the parallel resistance of the diagnostic modules of the fans in the array;

a comparator to compare the measured parallel resistance with the set of reference resistances; and a status module to determine the status of the fans based on the comparing.

12. The printer of claim 10, wherein the diagnostic module of each fan is configured to exhibit a respective first predetermined resistance when operating correctly, and a respective second predetermined resistance when failed.

13. The printer of claim 12, wherein the first predetermined resistance of each fan is unique with respect to the first predetermined resistances of the other fans in the array.

14. The printer of claim 10, wherein the monitoring module is to determine that at least one fan in the array has failed in response to the measured resistance being less than or equal to a predetermined resistance.

15. A method of determining a status of an array of electrical components, each respective electrical component having a diagnostic module exhibiting a first resistance when the respective electrical component is operating correctly, and a second resistance when the respective electrical component is not operating correctly, the method comprising:

measuring a parallel resistance of the diagnostic modules connected in parallel across a pair of diagnostic lines;

determining that all of the electrical components are operating correctly in response to the measured parallel resistance being substantially equal to a first reference resistance;

determining that one of the electrical components has failed in response to the measured resistance being substantially equal to a second reference resistance; and identifying which of the electrical components in the array is disconnected based on comparing the measured parallel resistance to a set of reference resistances, wherein the identifying identifies a first electrical component in the array as disconnected in response to the measured parallel resistance matching a third reference resistance of the set of reference resistances, and to identify a second electrical component in the array as disconnected in response to the measured parallel resistance matching a fourth reference resistance of the set of reference resistances.

16. The method of claim 15, wherein each the diagnostic modules of each electrical component has a unique resistance with respect to other diagnostic modules of the electrical components.

17. The method of claim 15, wherein the array of electrical components includes an array of fans.

* * * * *